United States Patent [19]

Peet

[11] 3,956,814

[45] May 18, 1976

[54] PROCESS OF MAKING LIDS FOR MICROELECTRONIC CIRCUIT GASES

[75] Inventor: Robert L. Peet, Yorba Linda, Calif.

[73] Assignee: Bliss & Laughlin Ind., Inc., Anaheim, Calif.

[22] Filed: May 21, 1975

[21] Appl. No.: 579,597

[52] U.S. Cl.............................. 29/414; 29/DIG. 12; 29/DIG. 16; 29/DIG. 37; 29/DIG. 40; 156/8
[51] Int. Cl.²......................................... B23P 17/00
[58] Field of Search ............ 29/413, 412, 414, 417, 29/DIG. 12, DIG. 40, DIG. 16, DIG. 37; 156/6, 7, 8; 113/121 R, 121 A, 1 F, 116 P, 116 QA, 116 Y

[56] References Cited
UNITED STATES PATENTS

| 1,093,698 | 4/1914 | Heaton | 29/DIG. 37 |
| 2,743,506 | 5/1956 | Solow | 29/413 X |
| 3,571,899 | 3/1971 | Sobieski | 29/417 X |
| 3,691,654 | 9/1972 | Siegel | 29/414 X |
| 3,909,908 | 10/1975 | Brefka | 29/417 |

*Primary Examiner*—Victor A. Di Palma
*Attorney, Agent, or Firm*—Harris, Kern, Wallen & Tinsley

[57] ABSTRACT

A process for forming stepped lids for microelectronic circuit cases. A plurality of interconnected lids is etched in a metal sheet with the lids oversize. Individual lids are stamped from the sheet to the desired size, providing substantially square corners at the edge of the lid and a substantially flat rim for engagement with the case.

4 Claims, 6 Drawing Figures

PROCESS OF MAKING LIDS FOR MICROELECTRONIC CIRCUIT GASES

This invention relates to microelectronic circuit packages and in particular to a new and improved process for making stepped lids for microelectronic circuit cases. Microelectronic circuits, such as integrated circuit chips, substrates and the like, are packaged in a variety of configurations. One widely used technique is to mount the circuit component in a metal case with a plurality of feed through conductors and weld a lid to the case to provide a hermetic seal. The cases are quite small, typically in the order of ½ by ½ inch to 3 by 3 inches and in the order of ⅛ inch thick. The circuit components are produced in large quantities and there is a continuous demand for more rapid packaging techniques and less expensive packages. Where hermetic sealing is required, the rejection rate due to poor welding of the lid to the case has been relatively high. Stepped lids, that is, lids with a thicker central portion and a thinner rim portion, are widely used to provide a relatively strong lid while having a thin rim suitable for welding. Continuous seam welding is employed in automatic high-speed welding operations for assembling the lid to the case.

The cases and lids for the microelectronic circuit packages normally are made of an iron-nickel-cobalt alloy ASTM Spec F-15, or steel, and a variety of techniques have been tried in the manufacture of the components. The stepped lid normally is made by an etching process with a large number of lids being formed from a metal sheet in the etching operation. The individual lids are then cut from the sheet by scissors or shears. This etching process does permit high-speed and relatively inexpensive preparation of uniform lids. However the etching does produce tapered edges and rounded corners in the small lids. Also, the individual lids are interconnected by straps in the etching process and remnants of the straps remain on the lids after the individual lids are severed. These tapered edges and strap remnants are undesirable and cause problems in the welding of the lid to the case. Accordingly, it is an object of the present invention to provide a new and improved process for lid manufacturing producing a stepped lid particularly suited for use in continuous seam welding of lids to cases in microelectronic circuit packages. Other objects, advantages, features and results will more fully appear in the course of the following description.

Figure 1:
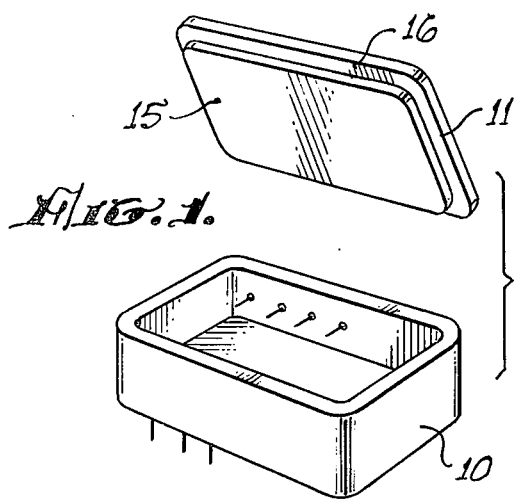
FIG. 1 is a perspective view of a microelectronic circuit case and lid.
Figure 2:
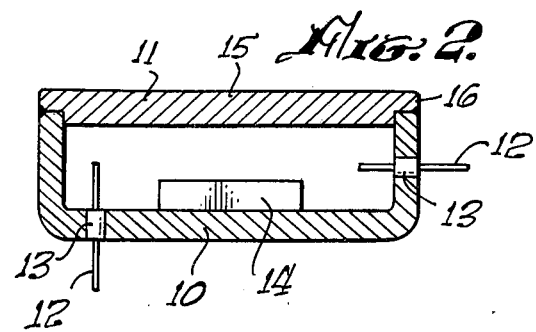
FIG. 2 is a sectional view through the case of FIG. 1 showing the lid in place.

A typical microelectronic circuit case 10 and lid 11 are shown in FIGS. 1 and 2. The case may be drawn from a single sheet or may be fabricated by attaching four sides to a bottom. Feed-through conductors 12 in insulators 13 may be mounted in the case bottom and/or sides. The circuit component 14 is mounted in the case with appropriate connections to the leads, after which the lid 11 is welded in place.

The lid preferably is stepped, with a thicker central portion 15 and a thinner rim portion 16. A typical lid will be in the order of 0.010 to 0.015 inches thick at the central portion and 0.005 inchs thick at the rim. The ideal lid will have flat surfaces and square corners at the rim for optimum fit and welding.

Figure 3:
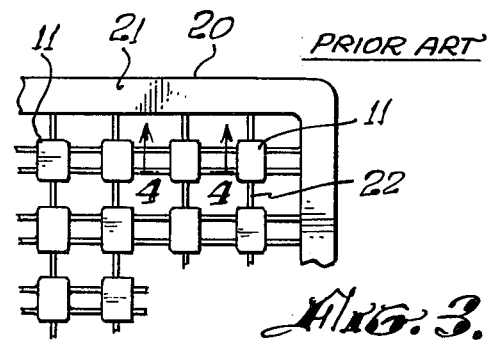
FIG. 3 is a plan view of a portion of a metal sheet showing a plurality of lids interconnected by straps as produced by the prior art process.
Figure 4:
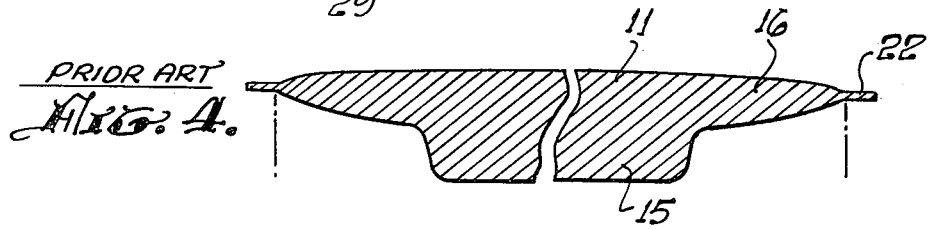
FIG. 4 is an enlarged sectional view taken along the line 4—4 of FIG. 3 showing a completed lid produced by the prior art process.

However lids with such an ideal configuration are not readily produced at high rates and inexpensively. The cases and lids typically are made of a nickel-iron-cobalt alloy ASTM F-15 or steel. In the past, the stepped lids have been made by an etching and severing process which does produce lids at high rate and relatively inexpensively. The conventional etching process and etched lid are shown in FIGS. 3 and 4.

A metal sheet 20 is masked in a pattern of a plurality of lids 11 of the desired length and width, with the lids interconnected and connected to the edge 21 of the sheet by straps 22. The mask may be formed in the conventional manner, as by covering the metal sheet with a photosensitive material, exposing the material to radiation through appropriate negatives, and developing the photosensitive material to leave the mask in the desired pattern. The sheet is then placed in the etching solution for the appropriate time, after which the masking material is removed, leaving a plurality of lids interconnected by straps. The individual lids are then cut from the sheet by scissors, and a cross-section of a typical prior art lid is shown in FIG. 4.

The rim portion 16 tapers toward the edge as a result of the etching step. Also, there is a remnant of the strap 22 which projects from the edge of the lid. Both the taper and the remnant are undesirable and contribute to poor fit of the lid on the case and poor welding.

Figure 6:
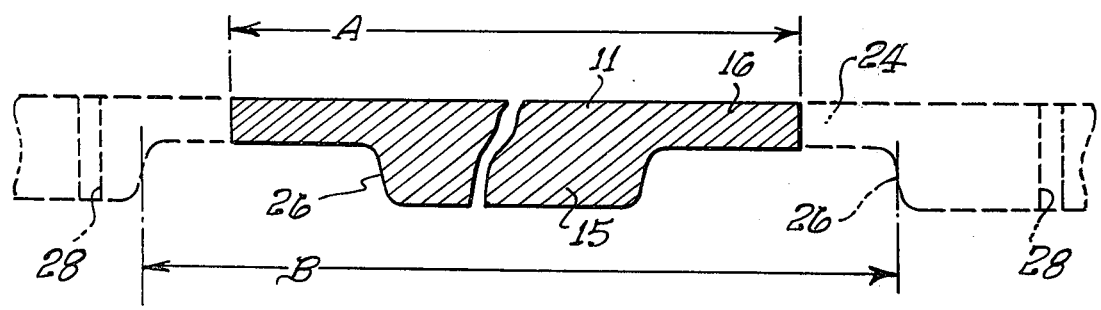
FIG. 6 is an enlarged sectional view taken along the line 6—6 of FIG. 5 showing a completed lid.

The new process of the present invention eliminates the strap remnant at the edge of the rim portion and substantially eliminates the taper providing substantially square corners at the edge of the lid, thereby closely approaching the ideal configuration. The process of the invention utilizes etching as in the prior art. However in making the pattern, the straps are omitted and the individual lids are made of a length and width greater than the desired length and width of the finished lid. For example, in FIGS. 4 and 6, the desired width for the lid 11 is A. In making the patterns for the lid in the process of the invention, the lid is made with a width B.

Figure 5:
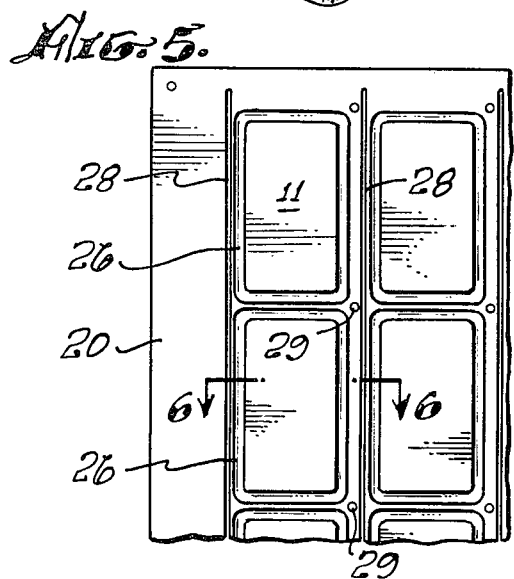
FIG. 5 is a view similar to that of FIG. 3 showing a sheet of lids produced by the presently preferred embodiment of the invention.

Referring to FIG. 5, the thinner rim portions 16 of the lids 11 are formed by etching channels 26 in one surface of the sheet 20. After the masking, etching and cleaning steps have been completed, the sheet with the plurality of etched stepped lids is ready for separating into individual lids. This is accomplished by a stamping operation, typically in a punch press, with each individual lid being trimmed to the desired length and width in a single punching or stamping, leaving the lid with the configuration of FIG. 6. The portion 24 is trimmed off, leaving the rim portion 16 of width A and having substantially square corners and flat surfaces.

In the stamping operation, the individual lids may be stamped from the sheet 20, or alternatively, the sheet may be cut into strips after which individual lids are stamped from the strips. Slits 28 and registration holes 29 may be provided in the sheet 20 to facilitate cutting into strips and stamping. If desired, the lid stamping die may also be used to coin the lid for better definition of the central portion 15 and more uniform thickness of the rim portion 16. Cases and lids ordinarily are plated with a protective metal with the plating step performed while the plurality of lids are interconnected in the sheet. The plating step may be used with the process of the present invention when desired.

I claim:

1. A process for making lids of predetermined length and width for microelectronic circuit cases and the like, including the steps of:

masking a metal sheet in a pattern of a plurality of interconnected lids of length and width greater than said predetermined length and width;

etching the sheet to produce the plurality of interconnected lids with a thicker central portion and a thinner rim portion;

removing the masking material; and cutting individual lids from the sheet in a stamping operation trimming the lid to the predetermined length and width providing substantially square corners at the edge of the lid.

2. A process as defined in claim 1 including the step of plating a layer of another metal onto the etched sheet prior to the cutting step.

3. A process as defined in claim 1 wherein the cutting step includes first cutting the sheet of lids into strips of lids and then stamping individual lids from a strip.

4. A process as defined in claim 1 wherein the stamping includes coining the lid.

* * * * *